(12) United States Patent
Baum et al.

(10) Patent No.: US 8,875,063 B2
(45) Date of Patent: Oct. 28, 2014

(54) MASK LAYOUT FORMATION

(75) Inventors: Zachary Baum, Gardiner, NY (US);
Scott D. Halle, Slingerlands, NY (US);
Henning Haffner, Pawling, NY (US)

(73) Assignees: International Business Machines Corporation, Armonk, NY (US);
Infineon Technologies North America Corp., Milpitas, CA (US)

( * ) Notice: Subject to any disclaimer, the term of this patent is extended or adjusted under 35 U.S.C. 154(b) by 621 days.

(21) Appl. No.: 12/901,595

(22) Filed: Oct. 11, 2010

(65) Prior Publication Data

US 2012/0089953 A1    Apr. 12, 2012

(51) Int. Cl.
G06F 17/50     (2006.01)
G03F 1/00      (2012.01)
G03F 1/30      (2012.01)

(52) U.S. Cl.
CPC ................ *G03F 1/30* (2013.01); *G03F 1/0069* (2013.01)
USPC ................... 716/51; 716/50; 716/53; 716/54; 716/55; 430/5

(58) Field of Classification Search
None
See application file for complete search history.

(56) References Cited

U.S. PATENT DOCUMENTS

| | | | |
|---|---|---|---|
| 5,424,154 A | 6/1995 | Borodovsky | |
| 5,563,012 A | 10/1996 | Neisser | |
| 6,338,922 B1 * | 1/2002 | Liebmann et al. | 430/5 |
| 6,413,683 B1 | 7/2002 | Liebmann et al. | |
| 6,539,521 B1 * | 3/2003 | Pierrat et al. | 716/53 |
| 6,625,801 B1 * | 9/2003 | Pierrat et al. | 716/53 |
| 6,832,364 B2 * | 12/2004 | Heng et al. | 716/52 |
| 6,929,887 B1 | 8/2005 | Lin et al. | |
| 7,229,722 B2 | 6/2007 | Liebmann et al. | |
| 7,261,981 B2 | 8/2007 | Lavin et al. | |
| 7,266,798 B2 | 9/2007 | Mansfield et al. | |
| 7,310,797 B2 * | 12/2007 | Huckabay | 716/51 |
| 7,617,473 B2 | 11/2009 | Liebmann et al. | |
| 7,648,805 B2 | 1/2010 | Schroeder et al. | |
| 7,882,480 B2 * | 2/2011 | Ye et al. | 716/53 |
| 2004/0068712 A1 * | 4/2004 | Heng et al. | 716/21 |
| 2009/0079005 A1 | 3/2009 | Haffner et al. | |
| 2009/0081563 A1 | 3/2009 | Wang et al. | |
| 2010/0099032 A1 | 4/2010 | Zou et al. | |

OTHER PUBLICATIONS

Henning Haffner et al., "Paving the way to a full chip gate level double patterning application", Conference Proceedings, Published Oct. 30, 2007, 12 pages.

Jason E. Meiring et al., "ACLV Driven Double-Patterning Decomposition With Extensively Added Printing Assist Features (PrAFs)", Conference Proceedings, Published Mar. 26, 2007, 12 pages.

* cited by examiner

*Primary Examiner* — A. M. Thompson
(74) *Attorney, Agent, or Firm* — Yuanmin Cai; Hoffman Warnick LLC

(57) ABSTRACT

A method for forming a mask layout is described. A plurality of phase shapes are formed on either side of a critical feature of a design layout of an intergrated circuit chip having a plurality of critical features. A plurality of transition edges are identified from the edges of each phase shape. Each transition edge is parallel to critical feature. A transition space is identified as defined by one of the group including two transition edges and one transition edge. A transition polygon is formed by closing each transition space with at least one closing edge. Each transition polygon is transformed into a printing assist feature. A mask layout is formed from the printing assist features and critical features.

16 Claims, 13 Drawing Sheets

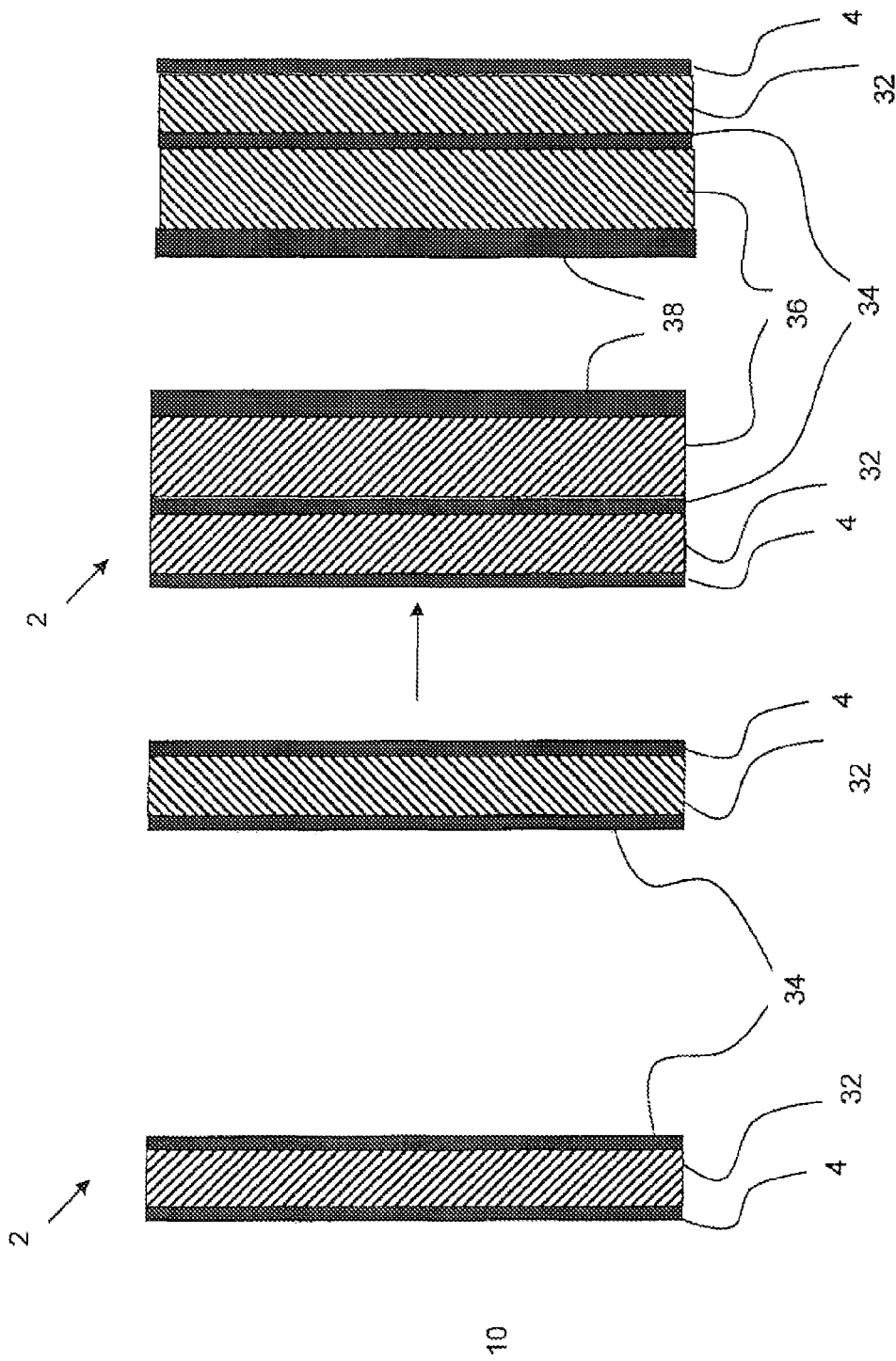

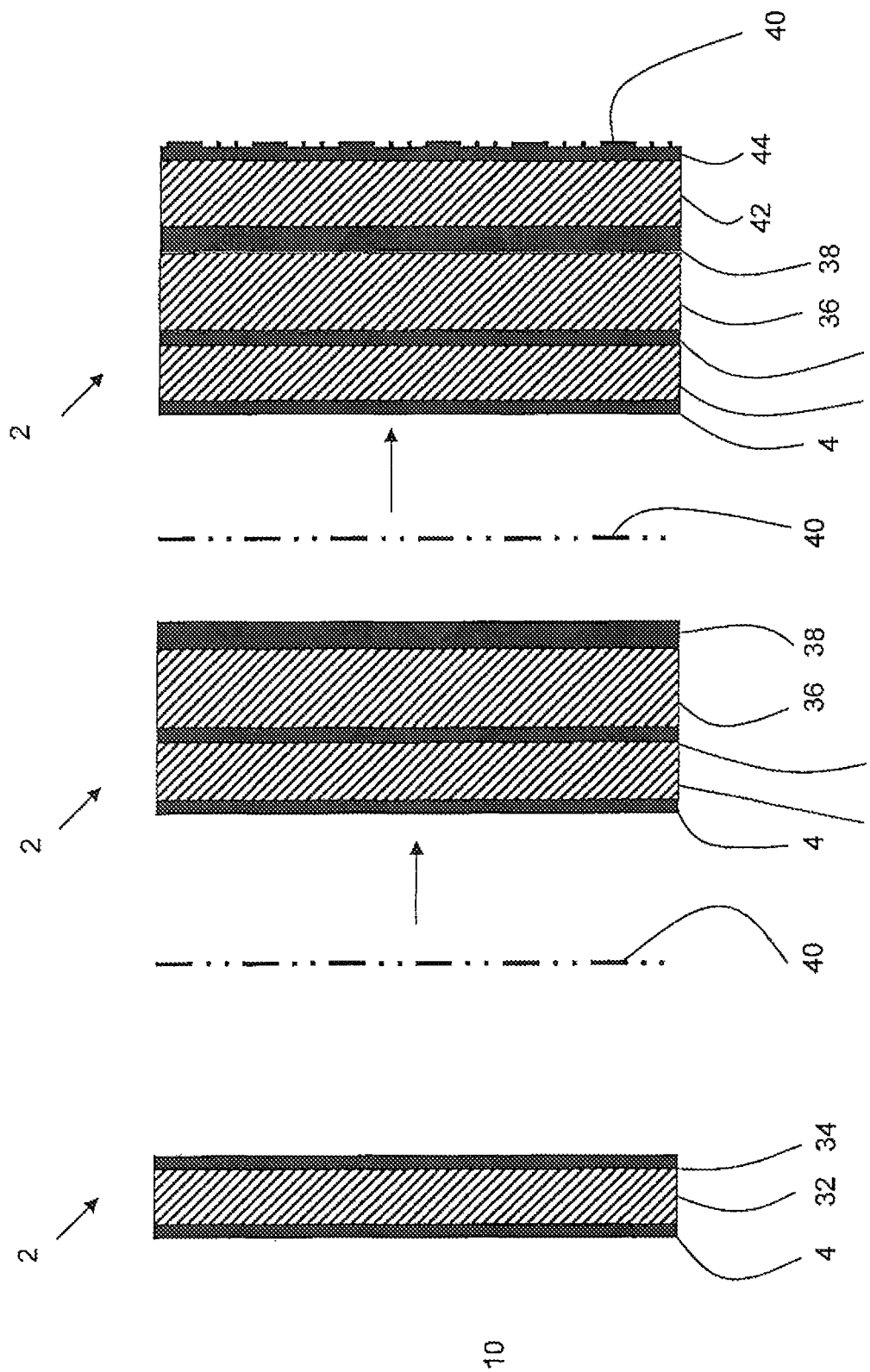

MASK LAYOUT FORMATION

BACKGROUND OF THE INVENTION

The present invention relates generally to forming mask layouts in integrated circuit chips. In particular, the present invention provides a method, computer program product, and computer system for forming mask layouts in integrated circuit chips by using phase shapes for forming printing assist features in developing critical features.

Integrated circuit chips continue to be used in an increasing variety of electronic devices. Simultaneously, the trend in integrated circuit chips is to create greater functional capacity with smaller devices. As a result, forming mask layouts for integrated circuit chips requires that smaller critical features be used.

Integrated circuit chips may be formed by depositing various material layers of conductive material over a silicon wafer or other suitable base. Each of the material layers may be etched by various means such as lithography, ion etching and other methods for creating wires, vias, switches and any number of circuitry features. All methods for etching conductive material have limitations as the desired feature becomes smaller.

As lithography methods become more aggressive in creating smaller features, they become more limited by diffraction and other effects. Alternating phase shift masks (altPSM) have found increased usage in lithography for integrated circuit chips manufacture and elsewhere because they allow creation of smaller dimension features.

Mask layers may be utilized to create the patterns that various methods such as lithography utilize for creating circuitry features. To enable aggressive lithography, double patterning or double exposure methods may be used. Double patterning and double exposure methods both create two mask layers, each mask layer requiring less aggressive lithography methods in creating features and thus allowing smaller features to be created with accuracy.

BRIEF SUMMARY OF EMBODIMENTS OF THE INVENTION

A method, computer program product, and system for mask layer formation is disclosed.

A first aspect of the invention includes a method, comprising forming a plurality of phase shapes on either side of a critical feature of a design layout of an integrated circuit chip having a plurality of critical features, wherein each phase shape has an edge; identifying a plurality of transition edges from the edges, wherein each transition edge is parallel to a critical feature; identifying a transition space defined by one of a group comprising: two transition edges, wherein the space is external to all phase shapes, and one transition edge, wherein the space is external to all phase shapes; forming a transition polygon by closing each transition space with at least one closing edge, wherein each closing edge is perpendicular to the plurality of transition edges; transforming each transition polygon into a printing assist feature; and forming a first mask layout or a second mask layout from the printing assist features and the critical features.

A second aspect of the invention includes a computer program product comprising program code embodied in at least one computer-readable storage medium, which when executed, enables a computer system to implement a method, the method comprising: forming a plurality of phase shapes on either side of a critical feature of a design layout having a plurality of critical features, wherein each phase shape has an edge; identifying a plurality of transition edges from the edges, wherein each transition edge is parallel to a critical feature; identifying a transition space defined by one of a group comprising: two transition edges, wherein the space is external to all phase shapes, and one transition edge, wherein the space is external to all phase shapes; forming a transition polygon by closing each transition space with at least one closing edge, wherein each closing edge is perpendicular to the plurality of transition edges; transforming each transition polygon into a printing assist feature; and forming a first mask layout or a second mask layout from the printing assist features and the critical features.

A third aspect of the invention includes a computer system, comprising: at least one processing unit; memory operably associated with the at least one processing unit; a mask layout formation system storable in memory and executable by the at least one processing unit, the mask layout formation system comprising: a phase shape system for forming a plurality of phase shapes on either side of a critical feature of a design layout having a plurality of critical features, wherein each phase shape has an edge; a transition edge system for identifying a plurality of transition edges from the edges, wherein each transition edge is parallel to a critical feature; a transition space system for identifying a transition space defined by one of a group comprising: two transition edges, wherein the space is external to all phase shapes, and one transition edge, wherein the space is external to all phase shapes; a transition polygon system for forming a transition polygon by closing each transition space with at least one closing edge, wherein each closing edge is perpendicular to the plurality of transition edges; a transformation system for transforming each transition polygon into a printing assist feature; and an exposure system for forming a mask layout from the printing assist features and the critical features.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 2-14 show steps in mask layout formation in embodiments of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF EMBODIMENTS OF THE INVENTION

Figure 1:
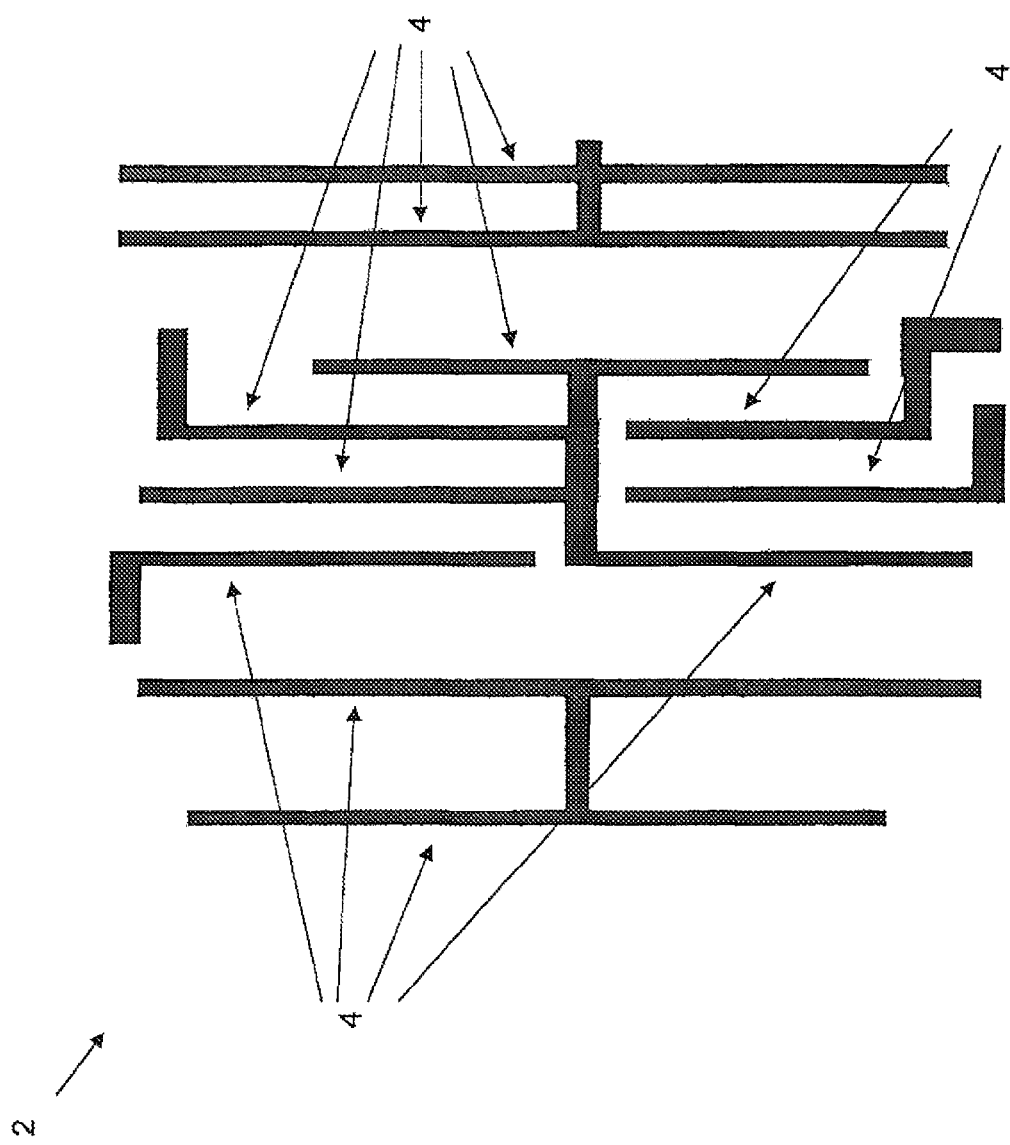
FIG. 1 shows a known design layout.

Referring to FIG. 1, a known design layout 2 is shown. A design layout 2 may include a pattern of a plurality of critical features 4 on at least one layer (not shown) of an integrated circuit chip (not shown). Critical features 4 may be lines, holes, or other shapes and the distance between those shapes that have sufficient fidelity to maintain device performance consistency and a critical dimension of a specified shape that must be within a design tolerance, where the ratio of the design tolerance vs. the critical dimension may typically be in the single digit percentage range. Design layout 2 may be provided by any known or yet to be discovered technique for creating a design layout 2. Design layout 2 is illustrative. A person skilled in the art will readily recognize that design layout 2 may be larger or smaller and may have a variety of shapes and features.

Figure 2:
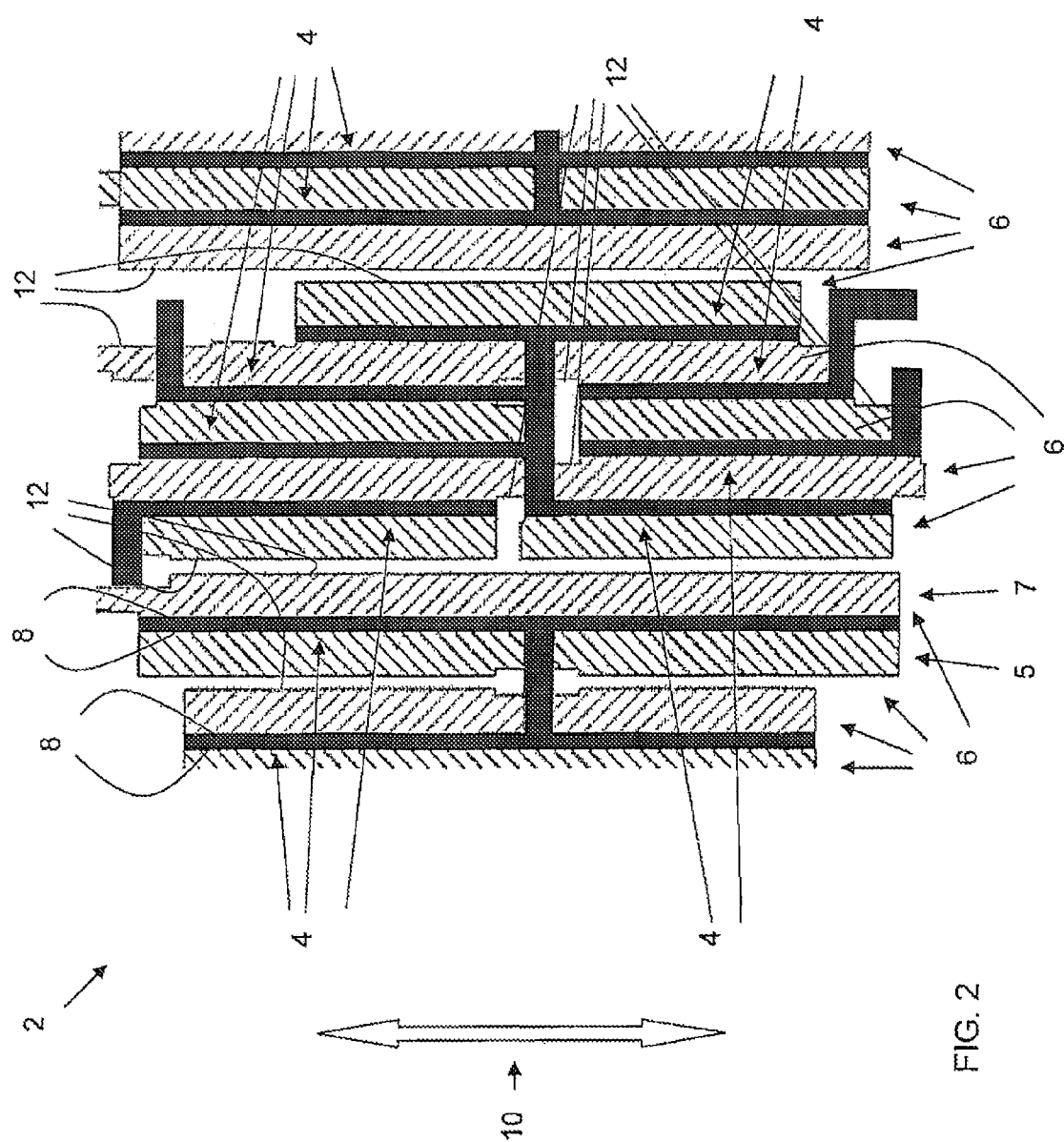

Referring to FIG. 2, a design layout 2 with a plurality of phase shapes 6 according to one embodiment of the invention is shown. Plurality of phase shapes 6 are formed on either side 8 of at least one critical feature 4 of design layout 2 having a plurality of critical features 4. Plurality of phase shapes 6 may be formed along one orientation 10 to critical features 4. Orientation 10 is illustrated as vertical with reference to FIG. 2. It should be recognized that orientation 10 may be horizontal, diagonal, radial, or any other two dimensional directions of critical features 4. Orientation 10 may vary in different areas of design layout 2. Each phase shape 6 of plurality of phase shapes 6 may have an edge 12. Forming of plurality of phase shapes 6 may be performed by using an algorithm typically used in electronic design automation software for generating darkfield alternating phase shift masks (altPSM), alternating phase shift masks, or any other known or to be developed method of generating phase shapes 6. Examples of commercially available electronic design automation software for generating the plurality of phase shapes 6 include Calibre PSMgate™ by Mentor Graphics Corporation and PSM-Create™ by Synopsys, Inc. A person skilled in the art will readily recognize that altPSM technology may generate each phase shape 6 as a right phase shape 5 or a left phase shape 7 and are illustrated in this manner in FIGS. 2-11.

Figure 3:
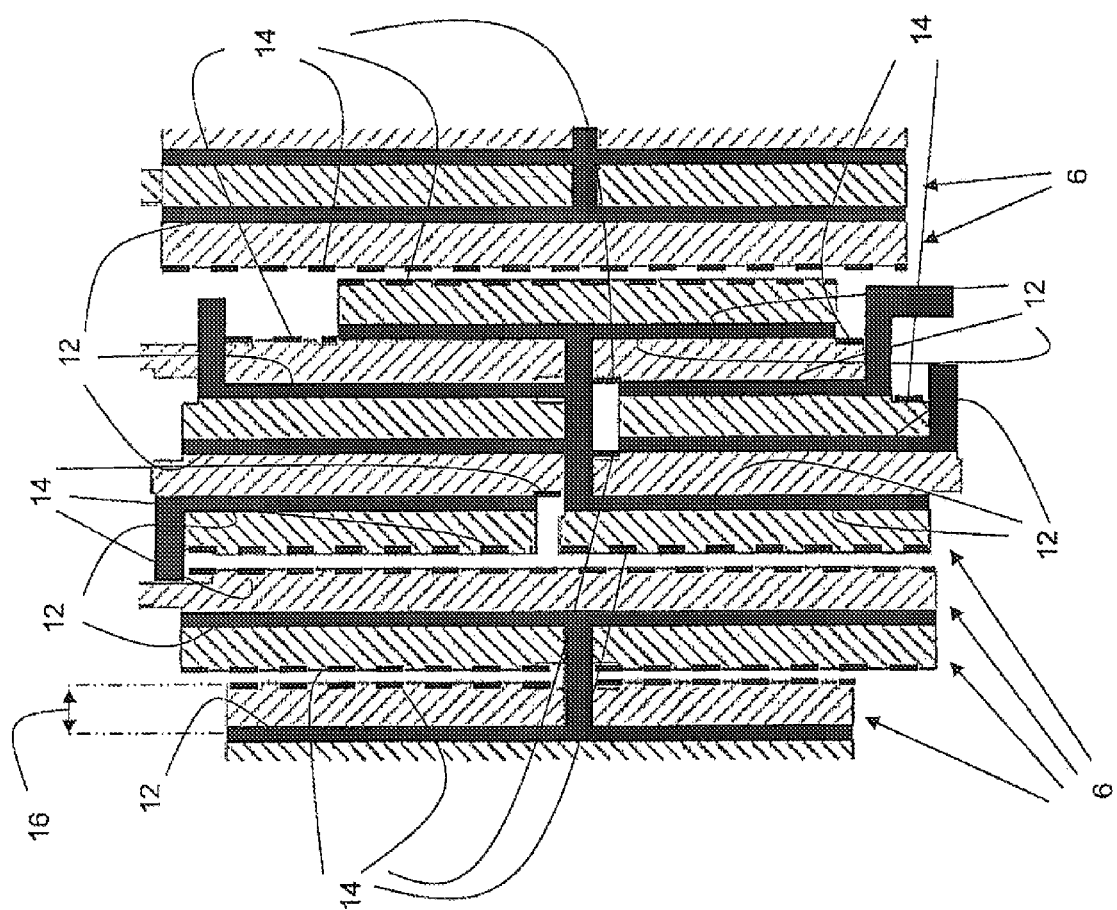

Referring to FIG. 3, a step in mask layout formation in one embodiment of the invention is shown. A plurality of transition edges 14 are identified from edges 12 of the plurality of phase shapes 6. Each transition edge 14 is parallel to a critical feature 4. In one embodiment of the invention, a substantially uniform distance 16 (e.g. pitch) may be identified from at least one critical feature 4. Alternatively, substantially uniform distance 16 may be identified from an edge of another phase shape 6.

Figure 4:
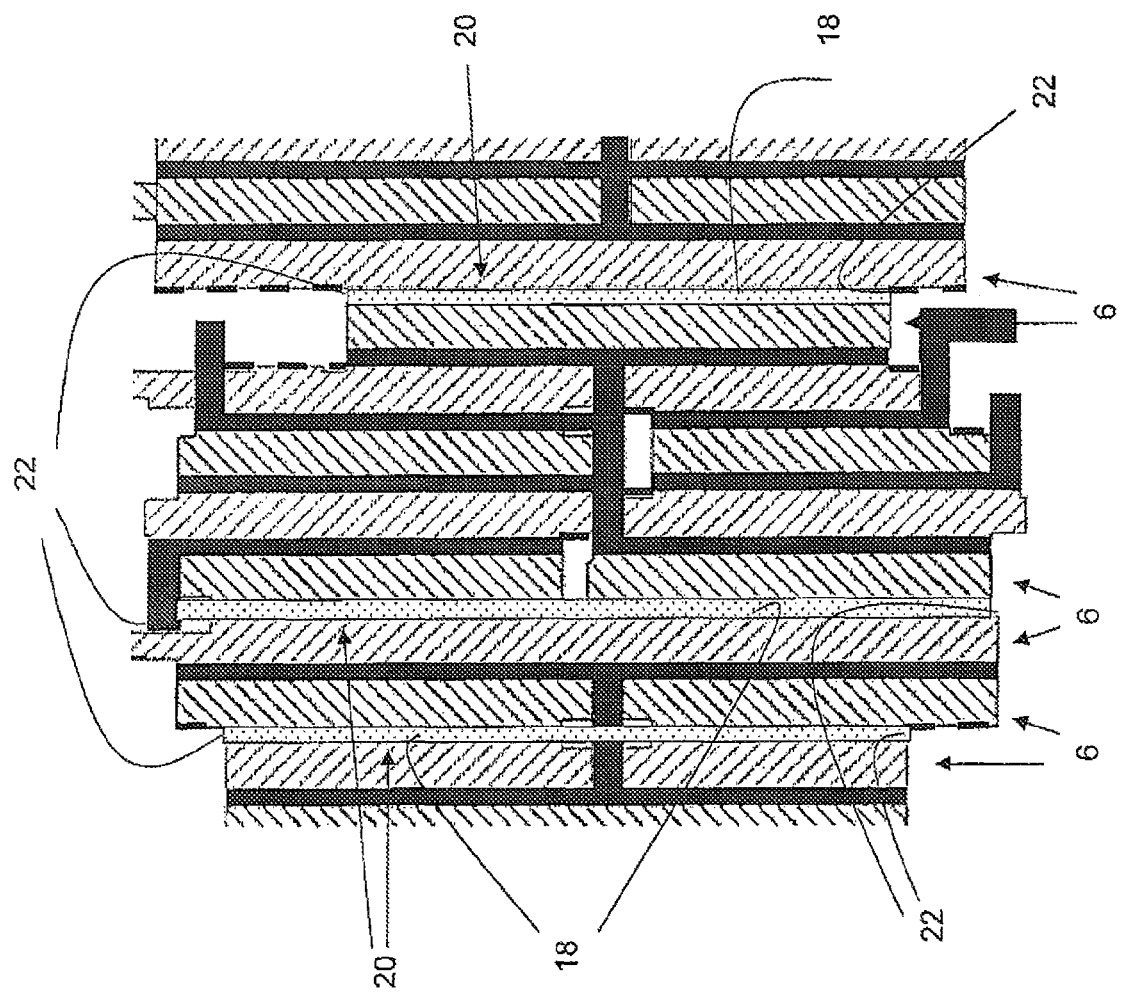

Referring to FIG. 4, a step in mask layout formation in one embodiment of the invention is shown. In one embodiment of the invention, at least one transition space 18 may be identified. In this embodiment, transition space 18 may be defined by two transition edges 14 (FIG. 3) wherein transition space 18 is external to all phase shapes 6. A transition polygon 20 may be formed by closing each transition space 18 with at least one closing edge 22. Each closing edge 22 may be perpendicular to the plurality of transition edges 14 (FIG. 3).

Figure 5:
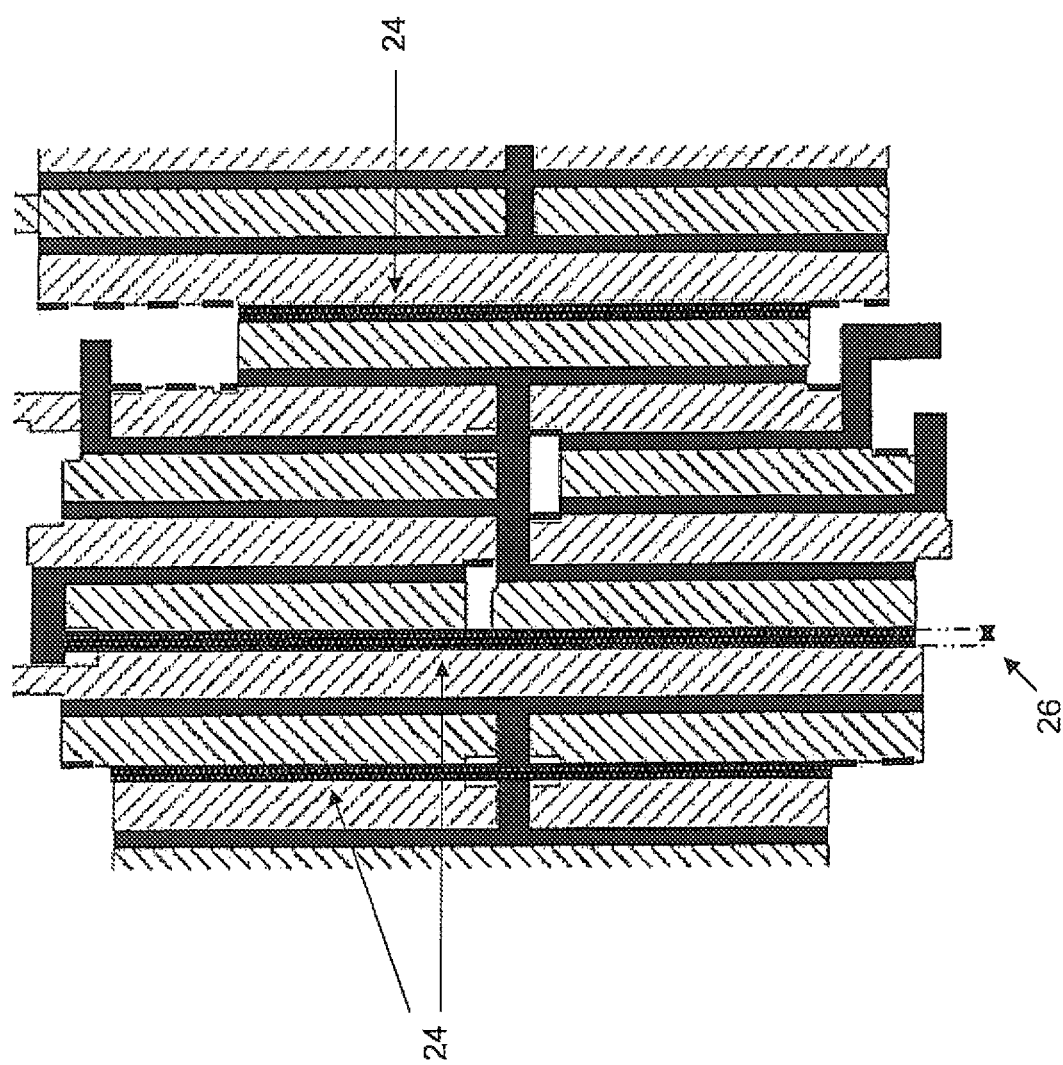

Referring to FIG. 5, a step in mask layout formation in one embodiment of the invention is shown. Each transition polygon 20 (FIG. 4) may be transformed into a printing assist feature 24. Printing assist feature 24 is an assist feature that during double exposure method is printed with a first exposure and removed with a second exposure.

Each printing assist feature 24 may be identified with a critical feature 4 (FIG. 2). A width 26 of each printing assist feature 24 may be adjusted. Each printing assist feature 24 may be cleaned. Cleaning printing assist feature may comprise modifying printing assist feature 24 to adhere to certain design rules, mask forming rules, or other constraints. Cleaning may improve lithographic resolution and the mask forming capabilities of small spaces and shape widths.

Figure 6:
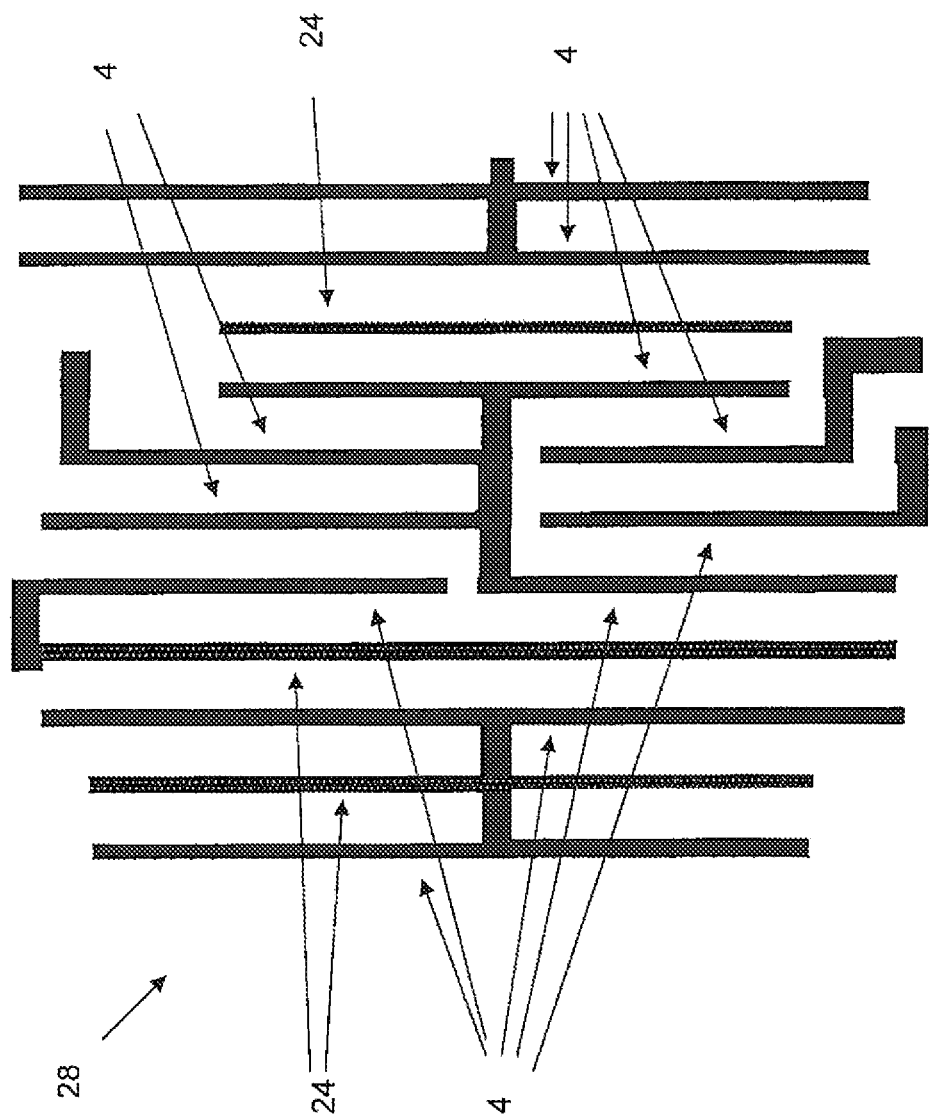

Referring to FIG. 6, a step in mask layout formation in one embodiment of the invention is shown. A first mask layout 28 may be formed from the printing assist features 24 and critical features 4.

Figure 7:
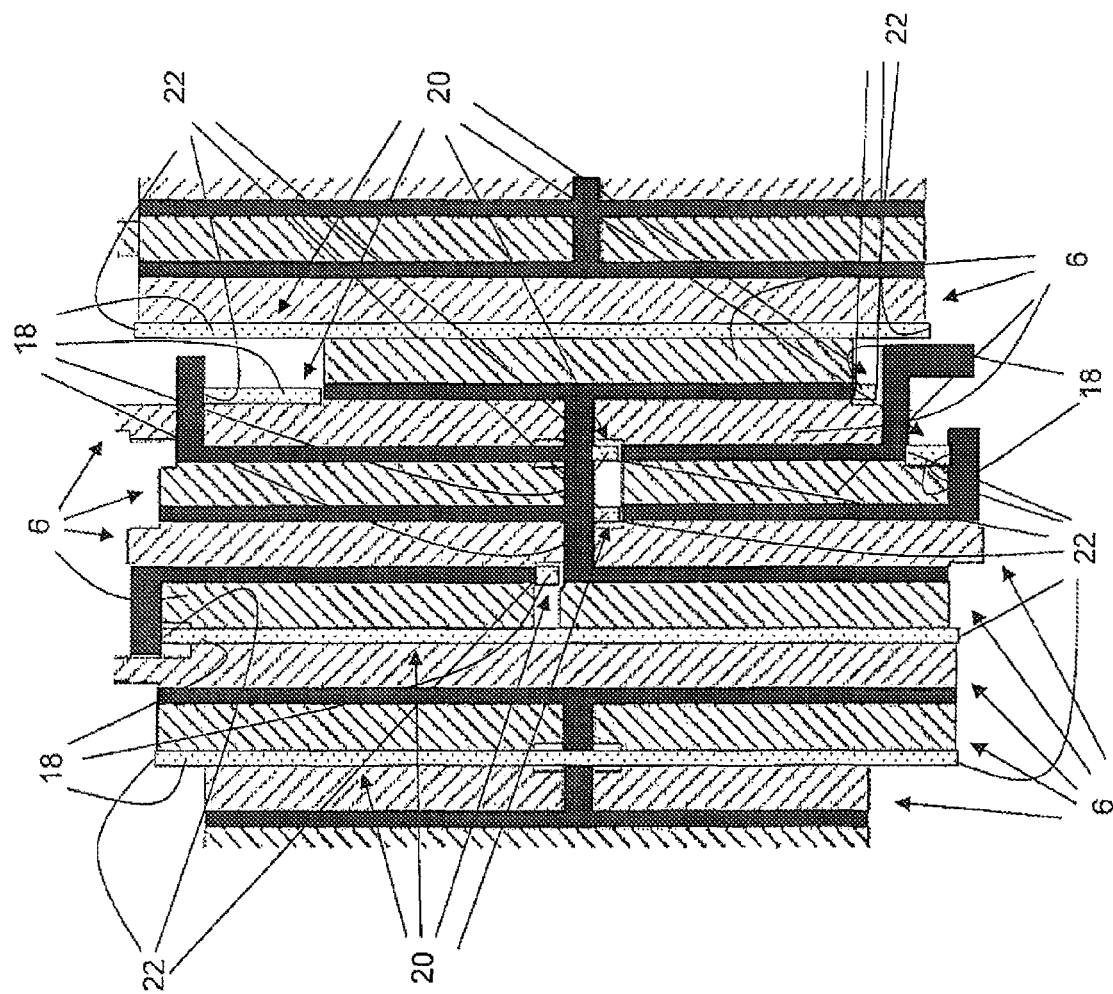

Referring to FIG. 7, a step in mask layout formation in one embodiment of the invention is shown. FIG. 7 illustrates an alternative embodiment to the steps described in FIG. 4. In FIG. 7, transition space 18 may be defined by one transition edge 14 (FIG. 3) wherein transition space 18 is external to all phase shapes 6. Transition polygon 20 may be formed by closing each transition space 18 with at least one closing edge 22. Each closing edge 22 may be perpendicular to the plurality of transition edges 14 (FIG. 3).

Figure 8:
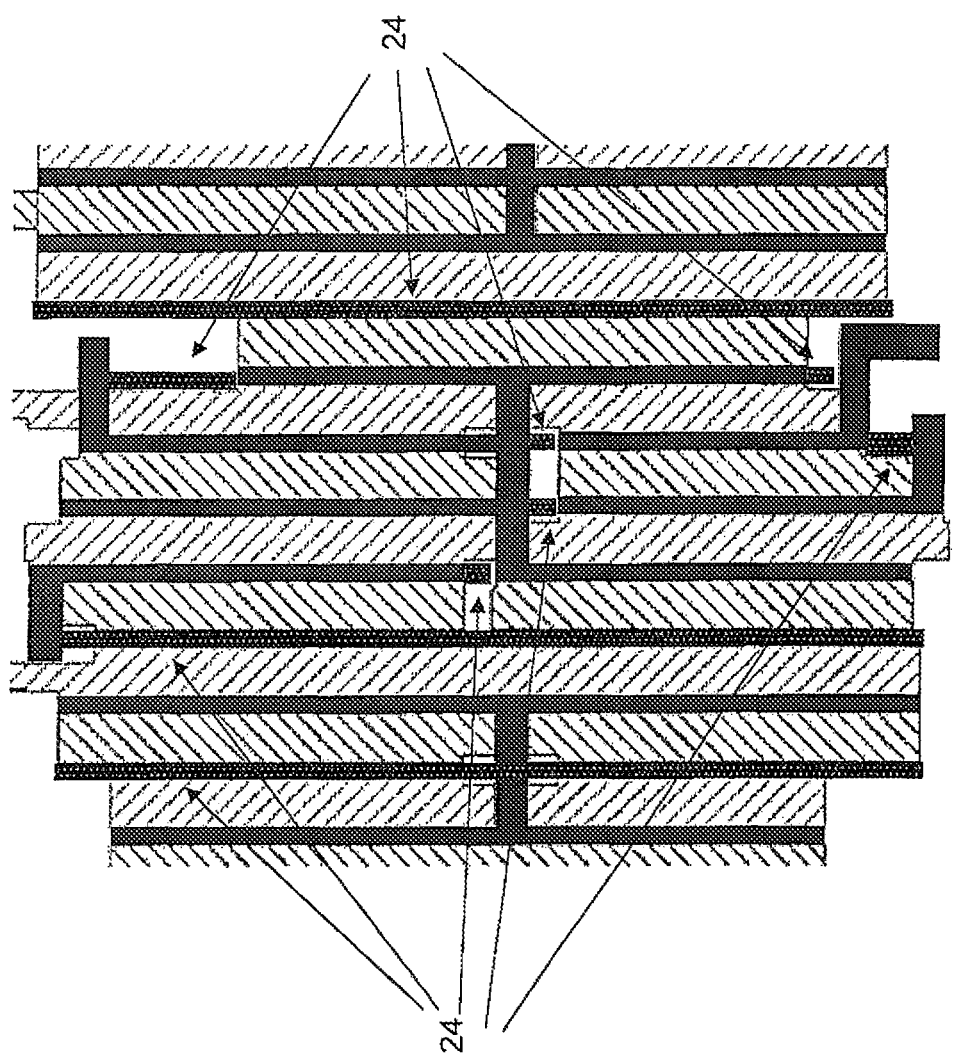

Referring to FIG. 8, a step in mask layout formation in one embodiment of the invention is shown. Each transition polygon 20 (FIG. 7) may be transformed into a printing assist feature 24. Transforming into a printing assist feature 24 may be performed by using a sub-resolution assist feature method.

Figure 9:
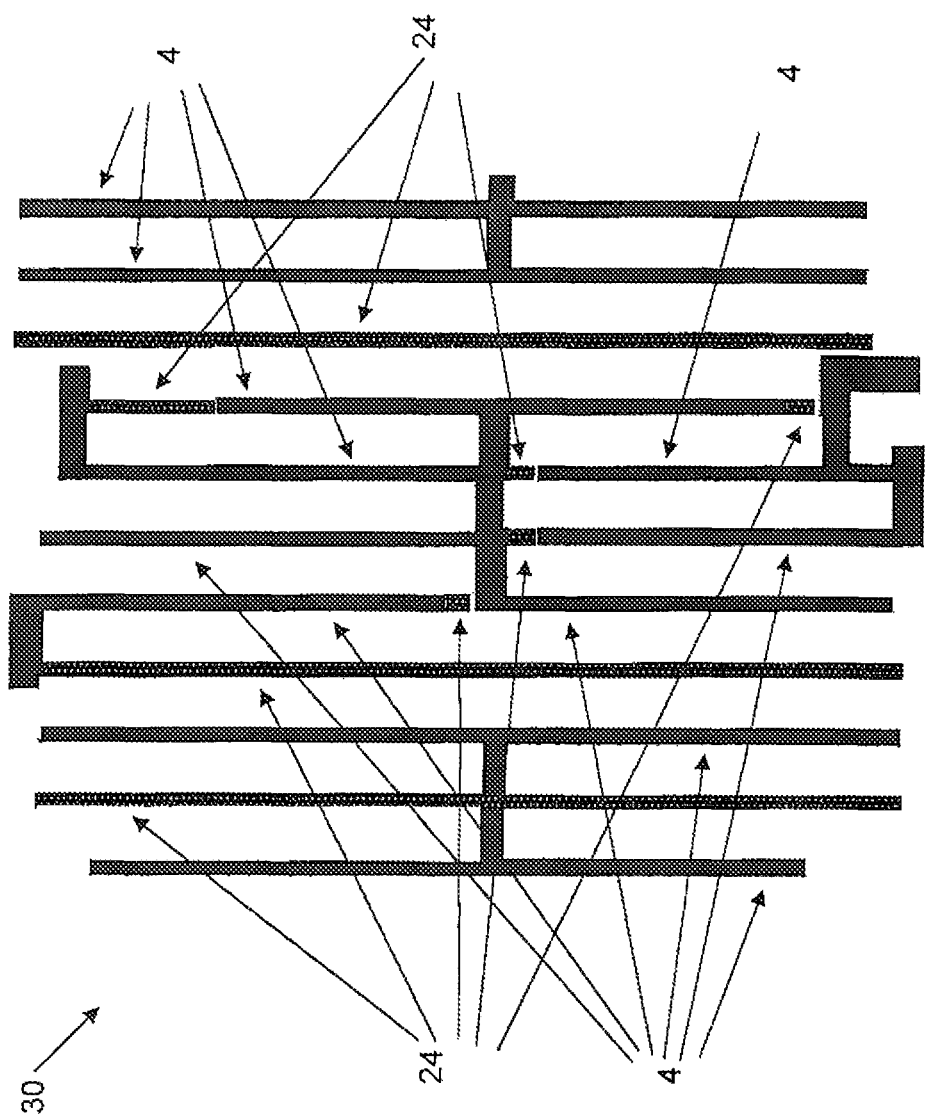

Referring to FIG. 9, a step in mask layout formation in one embodiment of the invention is shown. A second mask layout 30 may be formed from the printing assist features 24 and critical features 4.

It should be readily recognized that once printing assist features are formed as described herein (FIG. 5 and FIG. 8), additional printing assist features 24 may be formed by identifying printing assist features 24 as critical features 4 forming a plurality of phase shapes 6 and becoming a starting point for applying the methodologies described herein. The methodologies described herein could be repeated any number of times. As the methodologies are repeated, substantially uniform distance 16 (FIG. 3) and transition space 18 (FIG. 4) may be varied for each application of the method.

Referring to FIGS. 10 and 11, two steps in mask layout formation in one embodiment of the invention is shown. In FIG. 10, two critical features 4, a first set of a plurality of phase shapes 32, and a first set of a plurality of printing assist features 34 are shown. First set of plurality of phase shapes 32 and first set of a plurality of printing assist features 34 may be formed as described herein (FIG. 5 and FIG. 8). Referring to FIG. 11, a second set of plurality of phase shapes 36 may be generated adjacent to first set of plurality of printing assist features 34. In accordance with the methods described herein, a second set of a plurality of printing assist features 38 may be generated. As described herein, additional phase shapes 6 and printing assist features 24 may be generated in this manner.

Referring to FIGS. 12-14, three steps in mask layout formation in one embodiment of the invention is shown. In FIG. 12, critical feature 4, first phase shape 32, first printing assist feature 34, and edge of chip array 40 are shown. First phase shape 32 and first printing assist feature 34 may be formed as described herein (FIG. 5 and FIG. 8). Referring to FIG. 13, second phase shape 36 may be generated adjacent to first printing assist feature 34. In accordance with the methods described herein, a second printing assist feature 38 may be generated. Referring to FIG. 14, a third phase shape 42 may be generated adjacent to second printing assist feature 38. In accordance with the methods described herein, a third printing assist feature 44. In this embodiment of the invention, third printing assist feature 44 may placed substantially at edge of chip array 40.

Figure 15:
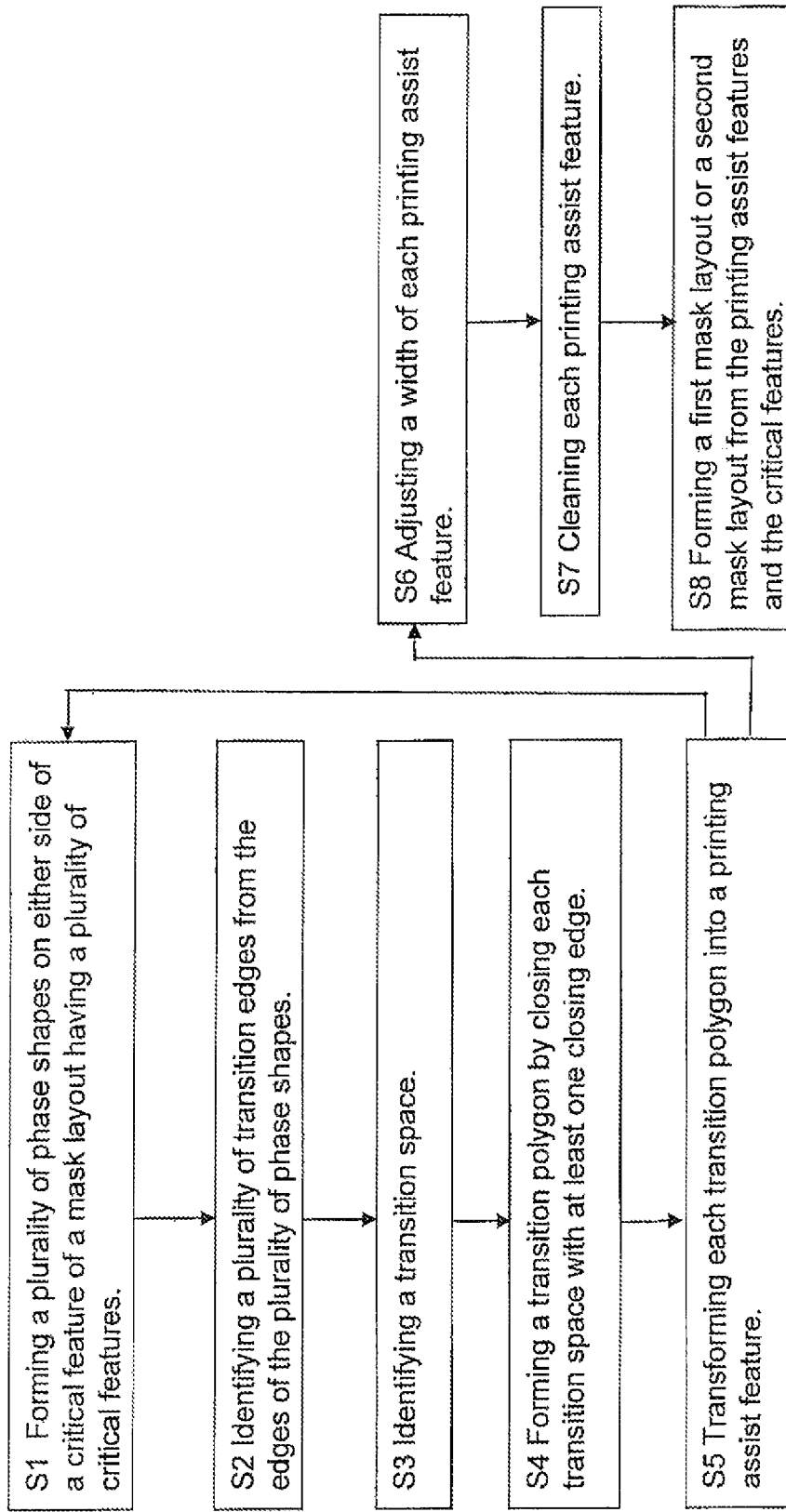
FIG. 15 shows a flow diagram of method of mask layout formation in one embodiment of the invention.

Referring to FIG. 15, a flow diagram of method of mask layout formation in one embodiment of the invention is shown. As more fully described herein, the following steps describe the method of mask layout formation: Forming a plurality of phase shapes 6 (FIG. 2) on either side of a critical feature 4 (FIG. 2) of a design layout 2 (FIG. 2) having a plurality of critical features 4. S1 Identifying a plurality of transition edges 14 (FIG. 3) from the edges 12 (FIG. 3) of the plurality of phase shapes 6. S2 Identifying a transition space 18 (FIG. 4). S3 Forming a transition polygon 20 (FIG. 4) by closing each transition space 18 with at least one closing edge 22 (FIG. 4). S4 Transforming each transition polygon 20 into a printing assist feature 24 (FIG. 5). S5 Adjusting a width of each printing assist feature 24. S6 Cleaning each printing assist feature 24. S7 Forming a first mask layout 28 (FIG. 6) or a second mask layout 30 (FIG. 9) from the printing assist features 24 and the critical features 4. S8.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 16:
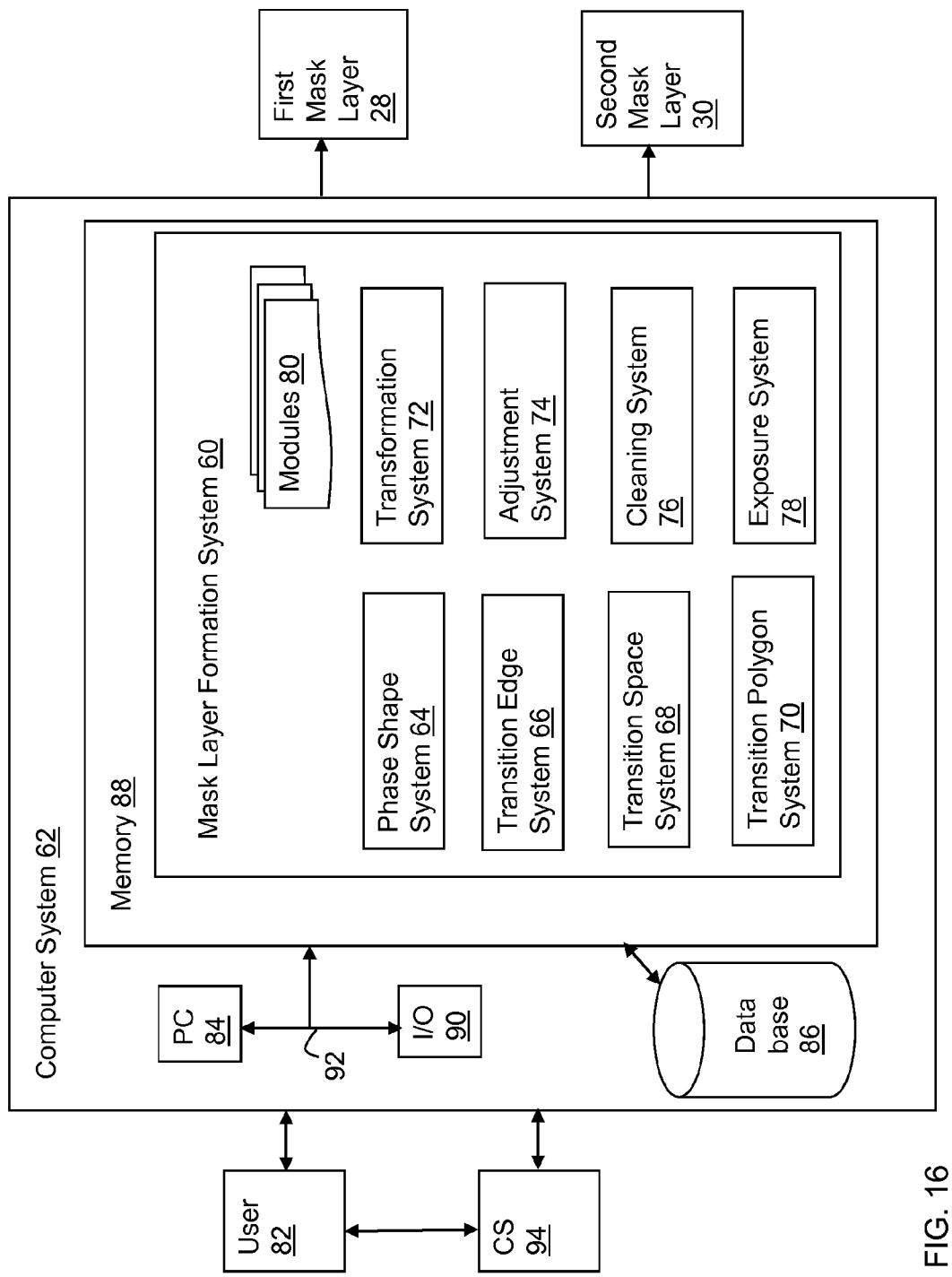
FIG. 16 shows a block diagram of one embodiment of an illustrative mask layout formation system in accordance with the invention.

The method described herein may be embodied in a mask layout formation system 60. Referring to FIG. 16, a block diagram of one embodiment of an illustrative mask layout formation system 60 in accordance with the invention. Computer system 62 may include mask layout formation system 60, which makes computer system 60 operable to form mask layouts. As indicated in FIG. 16, a phase shape system 64, a transition edge system 66, a transition space system 68, a transition polygon system 70, a transformation system 72, an adjustment system 74, a cleaning system 76, and an exposure system 78 may be optional components (or, modules 80) in mask layout formation system 60. Alternatively, a phase shape system 64, a transition edge system 66, a transition space system 68, a transition polygon system 70, a transformation system 72, an adjustment system 74, a cleaning system 76, and an exposure system 78 may be part of an external system which may perform the functions described herein.

Computer system 62 is shown in communication with a user 82 and or control system (CS) 94. A user 82 may be, for example, a programmer or operator. Computer system 62 is shown including a processing component 84 (e.g., one or more processors), a database 86, a memory 88, an input/output (I/O) component 90 (e.g., one or more I/O interfaces and/or devices), and a communications pathway 92. In one embodiment, processing component 84 executes program code, such as mask layout formation system 60, which is at least partially embodied in memory 88. While executing program code, processing component 84 can process data, which can result in reading and/or writing the data to/from database 86, memory 88 and/or I/O component 90 for further processing. Communications pathway 92 provides a communications link between each of the components in computer system 62. I/O component 90 can comprise one or more human I/O devices or storage devices, which enable user 82 and/or CS 94 to interact with computer system 62 and/or one or more communications devices to enable user 82 and/or CS 94 to communicate with computer system 62 using any type of communications link. To this extent, mask layout formation system 60 can manage a set of interfaces (e.g., graphical user interface(s), application program interface, and/or the like) that enable human and/or system interaction with mask layout formation system 60.

In any event, computer system 62 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, mask layout formation system 60 can be embodied as any combination of system software and/or application software.

Further, mask layout formation system 60 can be implemented using a set of modules 80. In this case, a module 80 can enable computer system 62 to perform a set of tasks used by mask layout formation system 60, and can be separately developed and/or implemented apart from other portions of mask layout formation system 60. Mask layout formation system 60 may include modules 80 which comprise a specific use machine/hardware and/or software. Regardless, it is understood that two or more modules, and/or systems may share some/all of their respective hardware and/or software. Further, it is understood that some of the functionality discussed herein may not be implemented or additional functionality may be included as part of computer system 62.

In one embodiment, the invention provides a computer program embodied in at least one computer-readable storage medium, which when executed, enables a computer system (e.g., computer system 62) to form mask layouts. To this extent, the computer-readable storage medium includes program code, such as mask layout formation system 60, which implements some or all of a process described herein. It is understood that the term "computer-readable storage medium" comprises one or more of any type of tangible medium of expression capable of embodying a copy of the program code (e.g., a physical embodiment). For example, the computer-readable storage medium can comprise: one or more portable storage articles of manufacture; one or more memory/storage components of a computing device; paper; and/or the like. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for forming a mask layout, comprising:
   forming a plurality of phase shapes on either side of a critical feature of a design layout of an integrated circuit chip having a plurality of critical features, wherein each phase shape has an edge;
   identifying a plurality of transition edges from the edges, wherein each transition edge is parallel to a critical feature, and wherein the identifying of the plurality of transition edges includes identifying a substantially uniform distance from at least one of the critical feature or the edge of another phase shape;
   identifying a transition space defined by one of a group comprising:
   two transition edges, wherein the space is external to all phase shapes, and one transition edge, wherein the space is external to all phase shapes;
   forming a transition polygon by closing each transition space with at least one closing edge, wherein each closing edge is perpendicular to the plurality of transition edges;
   transforming each transition polygon into a printing assist feature; and
   forming a first mask layout or a second mask layout from the printing assist features and the critical features.

2. The method of claim 1, further comprising:
   identifying the printing assist features as new critical features, wherein said identifying the printing assist features is subsequent to the transforming; and
   repeating the forming the plurality of phase shapes, the identifying the plurality of transition edges, the identifying the transition space, the forming the transition polygon, and the transforming steps of claim 1 to generate new printing assist features.

3. The method of claim 2, wherein the substantially uniform distance varies between each repeating.

4. The method of claim 1, wherein the transforming includes identifying each printing assist feature as a critical feature.

5. The method of claim 1, wherein the forming of the plurality of phase shapes includes applying at least one of dark field alternating phase shift masks and alternating phase shift masks.

6. The method of claim 1, further comprising:
   adjusting a width of each printing assist feature; and
   cleaning each printing assist feature.

7. A computer-readable storage medium embodying a computer program for forming a mask layout, which when executed, enables a computer system to implement a method, the method comprising:
   forming a plurality of phase shapes on either side of a critical feature of a design layout having a plurality of critical features, wherein each phase shape has an edge;
   identifying a plurality of transition edges from the edges, wherein each transition edge is parallel to a critical feature, and wherein the identifying of the plurality of transition edges includes identifying a substantially uniform distance from at least one of the critical feature or the edge of another phase shape;
   identifying a transition space defined by one of a group comprising:
   two transition edges, wherein the space is external to all phase shapes, and one transition edge, wherein the space is external to all phase shapes;
   forming a transition polygon by closing each transition space with at least one closing edge, wherein each closing edge is perpendicular to the plurality of transition edges;
   transforming each transition polygon into a printing assist feature; and
   forming a first mask layout or a second mask layout from the printing assist features and the critical features.

8. The computer-readable storage medium of claim 7, the method further comprising:
   identifying the printing assist features as new critical features; and
   repeating the forming the plurality of phase shapes, the identifying the plurality of transition edges, the identifying the transition space, the forming the transition polygon, and the transforming steps of claim 1 to generate new printing assist features.

9. The computer-readable storage medium of claim 8, wherein the substantially uniform distance varies between each repeating.

10. The computer-readable storage medium of claim 7, wherein the transforming includes identifying each printing assist feature as a critical feature.

11. The computer-readable storage medium of claim 7, wherein the forming of the plurality of phase shapes includes applying at least one of dark field alternating phase shift masks and alternating phase shift masks.

12. The computer-readable storage medium of claim 7, the method further comprising:
   adjusting a width of each printing assist feature; and
   cleaning each printing assist feature.

13. A mask layout formation system for, comprising:
   at least one computer hardware device including:
   a phase shape system for forming a plurality of phase shapes on either side of a critical feature of a design layout having a plurality of critical features, wherein each phase shape has an edge;
   a transition edge system for identifying a plurality of transition edges from the edges, wherein each transition edge is parallel to a critical feature, and wherein the identifying of the plurality of transition edges includes identifying a substantially uniform distance from at least one of the critical feature or the edge of another phase shape;
   a transition space system for identifying a transition space defined by one of a group comprising: two transition edges, wherein the space is external to all phase shapes, and one transition edge, wherein the space is external to all phase shapes;
   a transition polygon system for forming a transition polygon by closing each transition space with at least one closing edge, wherein each closing edge is perpendicular to the plurality of transition edges;
   a transformation system for transforming each transition polygon into a printing assist feature; and
   an exposure system for forming a first mask layout or a second mask layout from the printing assist features and the critical features.

14. The mask layout formation system of claim 13, wherein the transforming includes identifying each printing assist feature as a critical feature.

15. The mask layout formation system of claim 13, wherein the forming of the plurality of phase shapes includes applying at least one of dark field alternating phase shift masks and alternating phase shift masks.

16. The mask layout formation system of claim 13, further comprising:
- an adjustment system for adjusting a width of each printing assist feature; and
- a cleaning system for cleaning each printing assist feature.

* * * * *